United States Patent
Batruni

(10) Patent No.: US 7,613,759 B2
(45) Date of Patent: Nov. 3, 2009

(54) LOW-COMPLEXITY NONLINEAR FILTERS

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 997 days.

(21) Appl. No.: 11/061,850

(22) Filed: Feb. 18, 2005

(65) Prior Publication Data

US 2005/0212589 A1 Sep. 29, 2005

Related U.S. Application Data

(60) Provisional application No. 60/556,654, filed on Mar. 25, 2004.

(51) Int. Cl.
*G06F 17/10* (2006.01)

(52) U.S. Cl. .................................... 708/304

(58) Field of Classification Search .................. 708/304
See application file for complete search history.

(56) References Cited

U.S. PATENT DOCUMENTS

| | | | |
|---|---|---|---|
| 4,887,306 A | 12/1989 | Hwang et al. | |
| 5,243,624 A | 9/1993 | Paik et al. | |
| 5,563,954 A * | 10/1996 | Ono et al. | 381/94.7 |
| 5,775,293 A * | 7/1998 | Kresse | 708/304 |
| 6,856,191 B2 | 2/2005 | Batruni | |
| 6,885,323 B2 | 4/2005 | Batruni | |

\* cited by examiner

*Primary Examiner*—Tan V Mai
(74) *Attorney, Agent, or Firm*—Van Pelt, Yi & James LLP

(57) ABSTRACT

Processing an input signal that includes an input variable is disclosed. The input variable is compared to a set of ordered constants, the relative location of the input variable within a range of possible inputs is determined and a filter coefficient of a nonlinear filter is determined using the relative location of the input variable. A configurable filter includes an interface configured to receive an input signal that includes an input variable, a nonlinear filter coupled to the interface, configured to process the input signal, and a processor coupled to the nonlinear filter, configured to determine the relative location of the input variable within a range of possible inputs and to determine a filter coefficient of the nonlinear filter using the relative location of the input variable.

24 Claims, 11 Drawing Sheets

LOW-COMPLEXITY NONLINEAR FILTERS

CROSS REFERENCE TO OTHER APPLICATIONS

This application claims priority to U.S. Provisional Patent Application No. 60/556,654 entitled LOW-COMPLEXITY NONLINEAR FILTERS filed Mar. 25, 2004, which is incorporated herein by reference for all purposes.

FIELD OF THE INVENTION

The present invention relates generally to digital signal processing. More specifically, digital signal processing of nonlinear systems is disclosed.

BACKGROUND OF THE INVENTION

In digital signal processing systems, there is often a need to characterize and implement nonlinear functions. A traditional approach to nonlinear function characterization is the Volterra nonlinear expansion. Let the channel input signal vector be $V_n=[v_n \ v_{n-1} \ \ldots \ v_{n-N}]$ and the channel output be $y_n$. A simple example of a Volterra function is:

$$y_n = a_0 v_n + a_1 v_{n-1} + a_2 v_n^2 + a_3 v_n v_{n-1} + a_4 v_n^2 v_{n-1} \quad \text{(equation 1)}.$$

The Volterra function characterizes a nonlinear function having a set of fixed coefficients that multiply higher powers of the input data. In practice, it is often difficult to implement a nonlinear filter using a Volterra transfer function because of the higher order terms.

In U.S. patent application Ser. No. 10/418,944 filed Apr. 18, 2003, which is incorporated herein by reference for all purposes, a general nonlinear filter structure was described. The same filter function can be expressed using different forms. An example of a general form is:

$$y_n = A^T V_n + b + \sum_{j=1}^{K} c_j |\vec{\alpha}_j V_n + \beta_j|. \quad \text{(equation 2)}$$

Implementing a nonlinear filter based on this general form is typically easier than implementing a Volterra function. However, although nonlinear filters can be more easily implemented using nonlinear elements such as absolute value operators and min-max operators, the cost of implementation is often still significant due to the number of multiplication operations required to implement nonlinear functions using the generalized forms. It would be useful to have a more cost effective way to implement nonlinear filters. It would also be desirable if the cost savings would not significantly sacrifice filter performance.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An improved signal processing technique for nonlinear systems is disclosed. In some embodiments, one or more input variables are compared to a set of ordered constants to determine the relative locations of the input variables within a range of the possible inputs. One or more filter coefficients of a nonlinear filter are determined using the relative locations. The filter coefficients can be determined without using multiplication operations. In some embodiments, filter coefficients for zero order, first order, second order and/or higher order filters are pre-computed, stored and retrieved when appropriate. Higher order filters can be formed by nesting lower order filters.

Figure 1A:
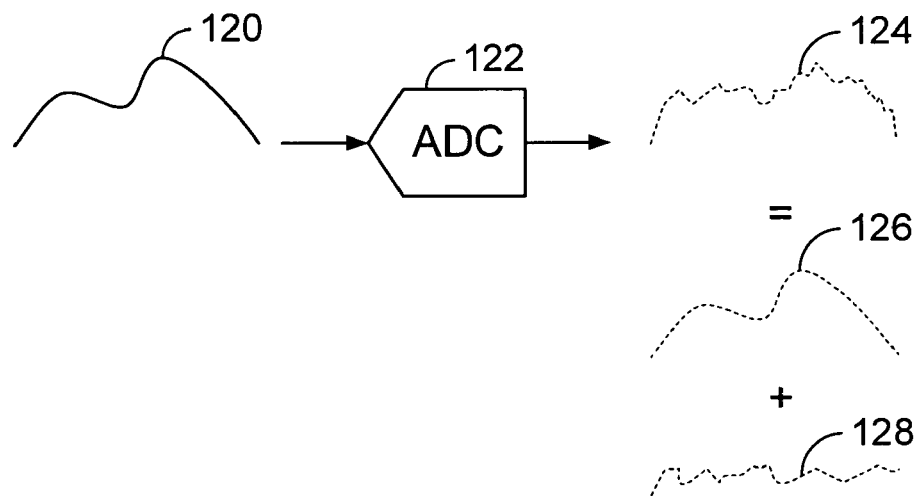
FIGS. 1A-1B are diagrams illustrating an example application of a nonlinear filter.
Figure 1B:
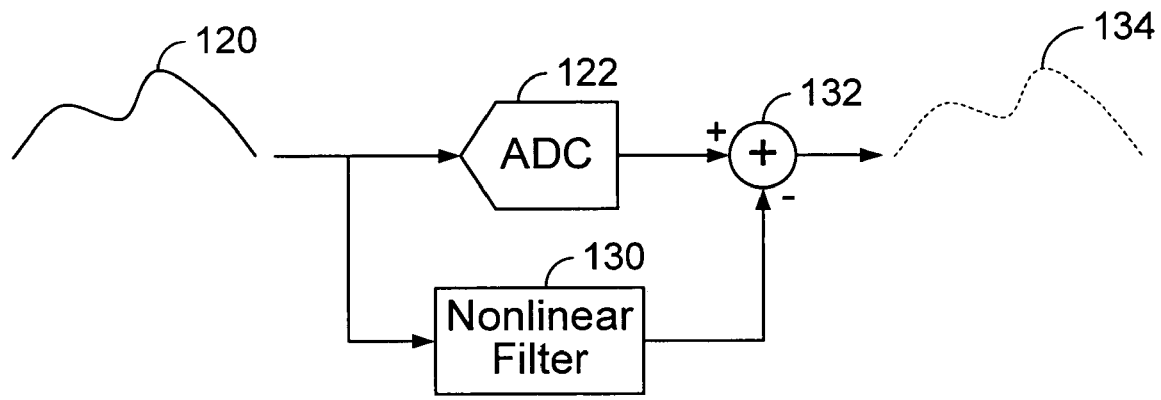

FIGS. 1A-1B are diagrams illustrating an example application of a nonlinear filter. In FIG. 1A, an input analog signal 120 is sent to an analog to digital converter (ADC) 122 to be converted into a digital signal 124. Because of component mismatches and other system characteristics, ADC 122 produces an output 124 that has some distortion. Signal 124 can be viewed as a combination of a component 126 that is an ideal digitized output based on the input and a digital distortion component 128. The digital distortion component is different from quantization error, which is equal to the portion of the analog signal that is below the finest ADC quantization level and typically cannot be reduced for an ADC with a predefined number of bits. The distortion component can be predicted and corrected if the distortion model is known.

In FIG. 1B, a nonlinear filter 130 is trained to model the distortion characteristic of ADC 122. Combiner 132 subtracts the distortion component from the ADC output to generate a distortion corrected output 134, which is approximately equal to the ideal digital output.

Figure 1C:
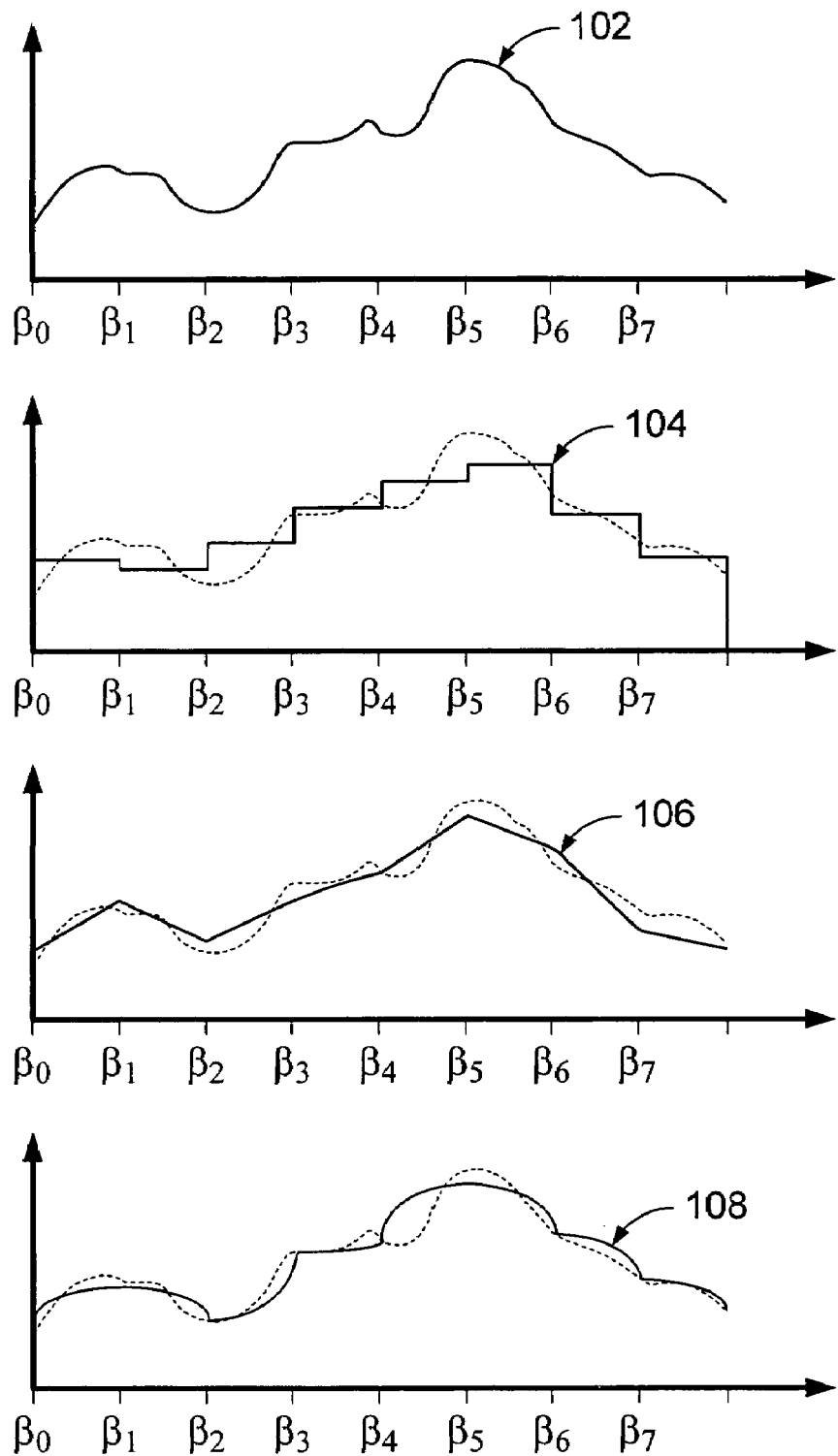
FIG. 1C is a diagram illustrating several ways of approximating a nonlinear filter response function.

FIG. 1C is a diagram illustrating several ways of approximating a nonlinear filter response function. In the example shown, the output is dependent on a one dimensional input. The techniques shown are also applicable to multi-dimensional inputs. In this example, nonlinear function 102 can be approximated as a zero order function 104, a first order function 106 or a second order function 108. As used herein, an N order function is expressed as:

$$y_n = \sum_{j=0}^{N} c_j v^j, \quad \text{(equation 3)}$$

where $c_j$ are coefficients.

In the example shown, the input range is divided into discrete sections, marked using a set of ordered constants $\beta_0$ to $\beta_7$. The number of sections depends on factors such as performance requirements and may vary for different embodiments. The distribution of $\beta$'s across the input range may be uniform or non-uniform depending on system implementation. The zero order function 104 is determined by approximating the transfer function in each portion of the input range (such as the input ranges between $\beta_0$ and $\beta_1$, between $\beta_1$ and $\beta_2$, etc.) using a linear, zero order function and then combining the functions. The approximation may be performed using least mean square error or other appropriate techniques to determine the suitable coefficients. Similarly, the first order approximation function 106 is comprised of linear first order approximation functions within each portion of the input range and the second order approximation 108 is comprised of nonlinear second order approximation functions within each portion of the input range. Higher order approximations are also possible.

The generalized nonlinear function of equation 2 can be transformed and approximation can be made based on the transformed function. The absolute value portion of the generalized nonlinear function can be written as:

$$|\vec{\alpha}_j V_n + \beta_j| = \text{sign}(\vec{\alpha}_j V_n + \beta_j)\{\vec{\alpha}_j V_n + \beta_j\} = \lambda_{jn}\{\vec{\alpha}_j V_n + \beta_j\} \quad \text{(equation 4),}$$

where $$\text{sign}(\vec{\alpha}_j V_n + \beta_j) = \lambda_{jn} \quad \text{(equation 5).}$$

Consequently, the general form of the nonlinear filter can be written as:

$$y_n = \left(a_0 + \sum_{j=1}^{K} c_j \alpha_{0j} \lambda_{jn}\right) v_n + \ldots + \quad \text{(equation 6)}$$

-continued $$\left(a_{2N-2} + \sum_{j=1}^{K} c_j \alpha_{2N-2j} \lambda_{jn}\right) v_{n-2N+2} + \left(b + \sum_{j=1}^{K} c_j \beta_j \lambda_{jn}\right),$$

which is equivalent to writing:

$$y_n = \tilde{a}_{0,n}(V_n) v_n + \ldots + \tilde{a}_{2N-2,n}(V_n) v_{n-2N+2} + \tilde{b}_n(V_n) \quad \text{(equation 7).}$$

The above equation can be viewed as a "linear" convolution between the input variables and the nonlinear coefficients that are time variant nonlinear functions of the input signal. The relative location of input $V_n$ in the multi-dimensional input space determines the values of the $\lambda_{jn}$ elements and therefore the values of the $\tilde{a}_{j,n}$ and $\tilde{b}_n$ coefficients. The dependence of the filter coefficient values on the input signal vector gives the filter its nonlinear property. The function is sometimes referred to as a first order nonlinear filter because the coefficient of each variable is a function that does not depend on the variable itself. In this case, the coefficient is a function of the sign of a function of the variables $v_{n-j}$.

Equation 6 can be rewritten in vector form as:

$$y_n = A^T V_n + b + [c_1 \lambda_{1n} \quad c_2 \lambda_{2n} \quad \ldots \quad c_K \lambda_{Kn}] \quad \text{(equation 8)}$$

$$\left\{\begin{bmatrix} \alpha_{0,1} & \alpha_{1,1} & \ldots & \alpha_{2N-2,1} \\ \alpha_{0,2} & \alpha_{1,2} & & \alpha_{2N-2,2} \\ & & \vdots & \\ \alpha_{0,K} & \alpha_{1,K} & \ldots & \alpha_{2N-2,K} \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix}\right\}.$$

The equation shows the dependence of the coefficients on $\lambda_{jn}$.

Once written in vector form, the filter can be further manipulated to achieve computational reductions. For example, the vectors form can be rewritten as:

$$y_n = A^T V_n + b + [c_1 \lambda_{1n} \quad c_2 \lambda_{2n} \quad \ldots \quad c_K \lambda_{Kn}] \quad \text{(equation 9)}$$

$$\left\{\begin{bmatrix} \alpha_{0,1} & 0 & \ldots & 0 \\ \alpha_{0,2} & 0 & \vdots & 0 \\ 0 & \alpha_{1,2} & 0 & 0 \\ 0 & \alpha_{1,3} & 0 & 0 \\ & & \vdots & \\ 0 & 0 & 0 & \alpha_{2N-2,K-1} \\ 0 & 0 & 0 & \alpha_{2N-2,K} \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix}\right\},$$

which can be further reduced to:

$$y_n = A^T V_n + b + [c_1 \lambda_{1n} \quad c_2 \lambda_{2n} \quad \ldots \quad c_K \lambda_{Kn}] \quad \text{(equation 10)}$$

$$\left\{\begin{bmatrix} 1 & 0 & \ldots & 0 \\ 1 & 0 & \vdots & 0 \\ 0 & 1 & 0 & 0 \\ 0 & 1 & 0 & 0 \\ & & \vdots & \\ 0 & 0 & 0 & 1 \\ 0 & 0 & 0 & 1 \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix}\right\},$$

which reduces the original equation to:

$$y_n = A^T V_n + b + \sum_{j=1}^{K_1} c_j |v_n + \beta_j| + \sum_{j=K_1+1}^{K_2} c_j |v_{n-1} + \beta_j| \ldots +$$

$$\sum_{j=K_{2N-3}+1}^{K_{2N-2}} c_j |v_{n-2N+2} + \beta_j| \quad \text{(equation 11)}$$

$$= A^T V_n + b + \sum_{j=1}^{K_1} c_j \lambda_{j,n} (v_n + \beta_j) +$$

$$\sum_{j=K_1+1}^{K_2} c_j \lambda_{j,n} (v_{n-1} + \beta_j) \ldots +$$

$$\sum_{j=K_{2N-3}+1}^{K_{2N-2}} c_j \lambda_{j,n} (v_{n-2N+2} + \beta_j),$$

which means $$y_n = \left( a_0 + \sum_{j=1}^{K_1} c_j \lambda_{jn} \right) v_n + \ldots + \quad \text{(equation 12)}$$

$$\left( a_{2n-2} + \sum_{j=K_{2N-3}+1}^{K_{2N-2}} c_j \lambda_{jn} \right) v_{n-2N+2} + \left( b + \sum_{j=1}^{K} c_j \beta_j \lambda_{jn} \right).$$

As will be shown in more details below, equation 12 has reduced computational burden because the calculation of $\lambda_j$'s does not require any multiplication. The computational savings of this function is significant compared to the generalized filter function, where a linear convolution $\vec{\alpha}_j V_n$ is performed before $\lambda_j$ is computed. Since the dependency on the input is of first order, the reduced nonlinear filter function is referred to as a first order low complexity filter function.

Other simplifications using vector manipulation are also possible. For example, $$y_n = A^T V_n + b + [c_1 \lambda_{1n} \quad c_2 \lambda_{2n} \quad \ldots \quad c_K \lambda_{Kn}] \quad \text{(equation 13)}$$

$$\left\{ \begin{bmatrix} 1 & 0 & \cdots & 0 \\ 1 & 0 & \vdots & 0 \\ 1 & 1 & 0 & 0 \\ 1 & 1 & 0 & 0 \\ & & \vdots & \\ 0 & 0 & 0 & 1 \\ 0 & 0 & 0 & 1 \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix} \right\}$$

produces a nonlinear filter $$y_n = \tilde{a}_{0,n}(v_n, v_{n-1}) v_n + \tilde{a}_{1,n}(v_n, v_{n-1}) v_{n-1} + \ldots +$$
$$\tilde{a}_{2N-2,n}(v_{n-2N+2}) v_{n-2N+2} + \tilde{b}_n(V_n) \quad \text{(equation 14)}$$

where each coefficient of the first two variables corresponds to a function of the first two variables, and each of the remaining coefficients are functions of the variable that they multiply.

Figure 2:
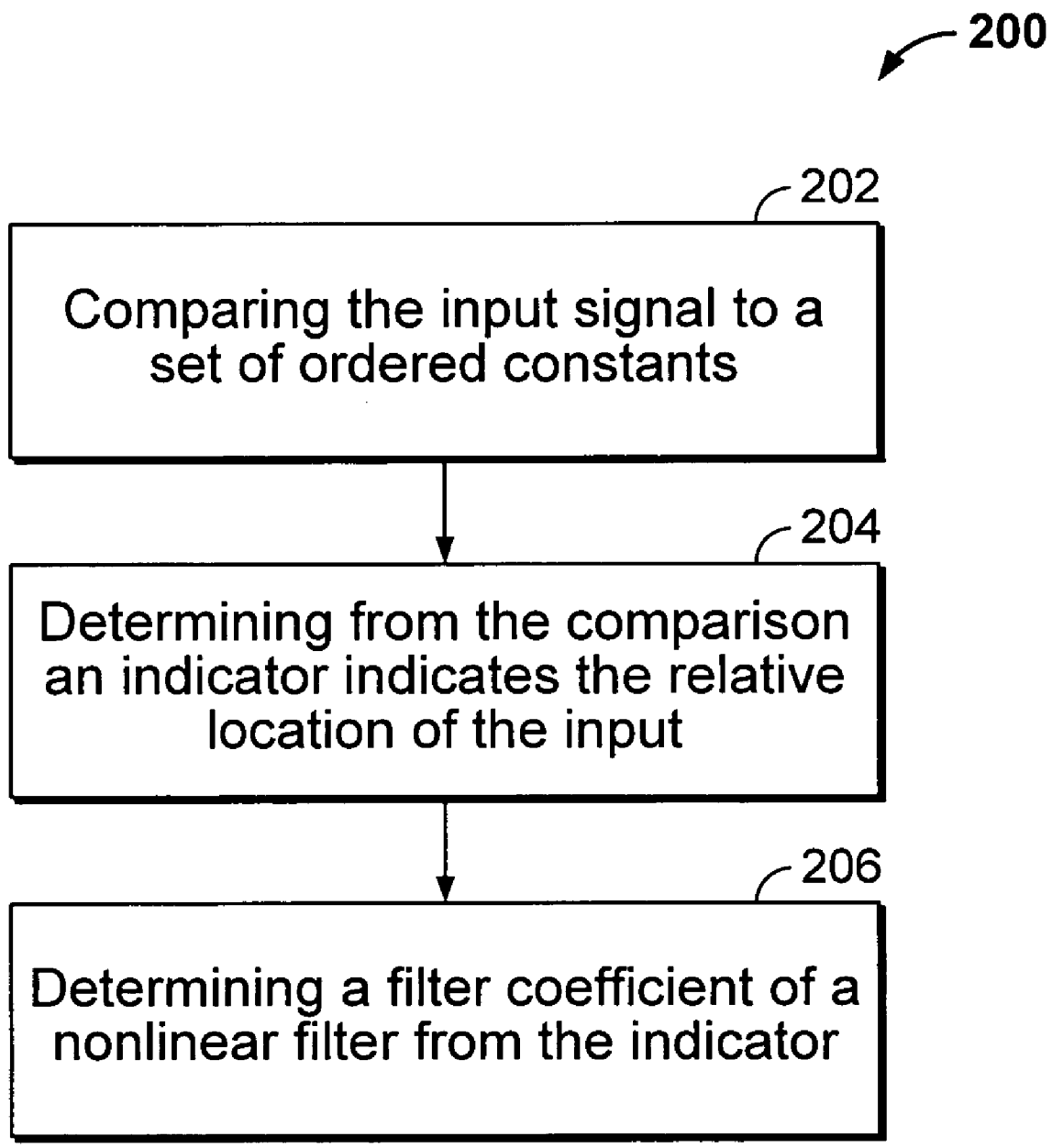
FIG. 2 is a flowchart illustrating the processing of an input signal according to some embodiments.

FIG. 2 is a flowchart illustrating the processing of an input signal according to some embodiments. Process 200 is applicable to various nonlinear filter embodiments, some of which are shown in more details below. An input variable of the input signal is compared to a set of ordered constants (202). In some embodiments, the set of ordered constants are the β constants that divide the input range into multiple sections. The relative location of the input variable within the range of possible inputs is determined (204). In some embodiments, the relative location is determined using the value of $\lambda_j$. Using the relative location, one or more filter coefficients of a nonlinear filter are determined (206). The coefficients, which depend on the inputs, may vary over time. The coefficients can be determined without requiring multiplication operations, allowing the filter to process its inputs efficiently. In some embodiments, the nonlinear filter is used to process the input and generate the output. In some embodiments, the nonlinear filter with the derived coefficients is used as a coefficient for a higher order nonlinear filter, which is then used to filter the input and generate the output.

Figure 3:
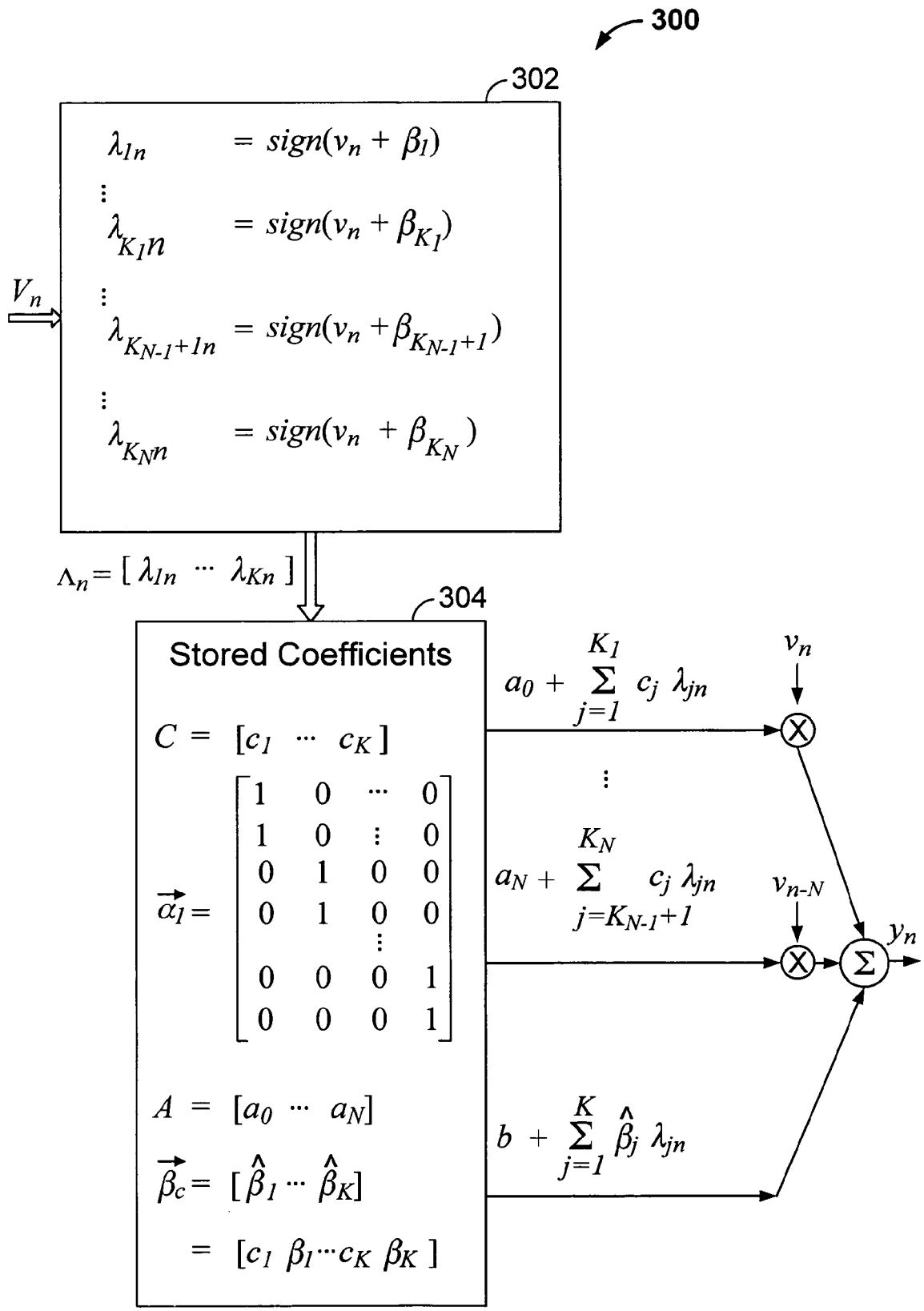
FIG. 3 is a block diagram illustrating a first order low complexity nonlinear filter embodiment.

FIG. 3 is a block diagram illustrating a first order low complexity nonlinear filter embodiment. Filter 300 shown in this example has a transfer function that is equivalent to equation 12. The input vector $V_n$ is sent to a sign processor 302 to generate $\lambda_{jn}$. The constant coefficients, including $c_j$, $a_j$, $c_j \beta_j$, are stored in a memory 304, which is implemented using registers or other appropriate data storage component. The first order coefficients of equation 12 are computed by multiplying λ with corresponding $c_j$ or $\beta_j$, summing the results, and adding to the corresponding constant $a_j$. The coefficients are then multiplied with an input variable v if appropriate. The results of the individual first order filters are combined to generate a nonlinear output $y_n$.

Figure 4:
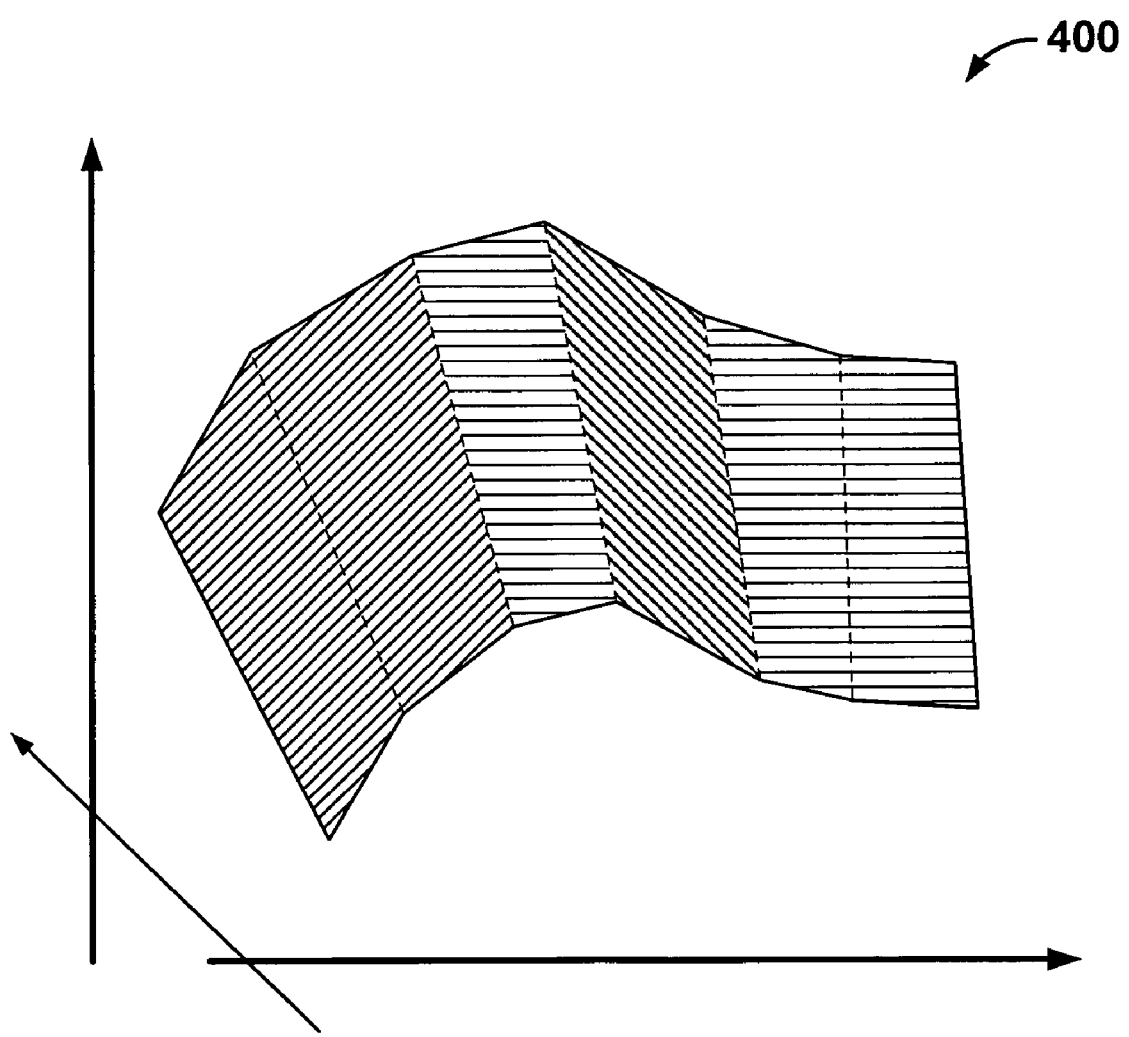
FIG. 4 is a diagram illustrating a 3-D manifold of the output of a first order nonlinear filter embodiment.

FIG. 4 is a diagram illustrating a 3-D manifold of the output of a first order nonlinear filter embodiment. In this example, filter function 400 is a function of two input variables. The first order terms form planar segments of the manifold. Function 400 can be used to approximate a continuous, 3-D nonlinear function. Functions involving higher dimensions can be approximated similarly.

As shown previously, the generalized nonlinear filter function of equation 2 can be transformed to a first order nonlinear filter as shown in equation 7. A further extension of the nonlinear filter transformation leads to another nonlinear filter expression:

$$y_n = f_{0,n}(V_n) v_n + \ldots + f_{2N-2,n}(V_n) v_{n-2N+2} +$$
$$\tilde{a}_{0,n}(V_n) v_n + \ldots + \tilde{a}_{2N-2,n}(V_n) v_{n-2N+2} + \tilde{b}_n(V_n) \quad \text{(equation 15)}$$

where each $f_{k,n}(V_n)$ is a first order nonlinear function $$f_{k,n}(V_n) = A_k^T V_n + b_k + \sum_{j=1}^{K} c_j^k |\vec{\alpha}_j^k V_n + \beta_j^k| \quad \text{(equation 16)}$$

$$= \tilde{a}_{0,n}^k(V_n) v_n + \ldots + \tilde{a}_{2N-2,n}^k(V_n) v_{n-2N+2} +$$
$$\tilde{b}_n^k(V_n).$$

Thus, the terms of equation 15 that have $f_{k,n}(V_n)$ as coefficients are second order functions of the input variables (as used herein, a second order function includes at least one term of an input variable to the power of 2 or a cross product of input variables). In different embodiments, the coefficients may be multiplied by the input variable, a delayed input variable, a derivative of the input, or other appropriate characteristics of the input.

Figure 5:
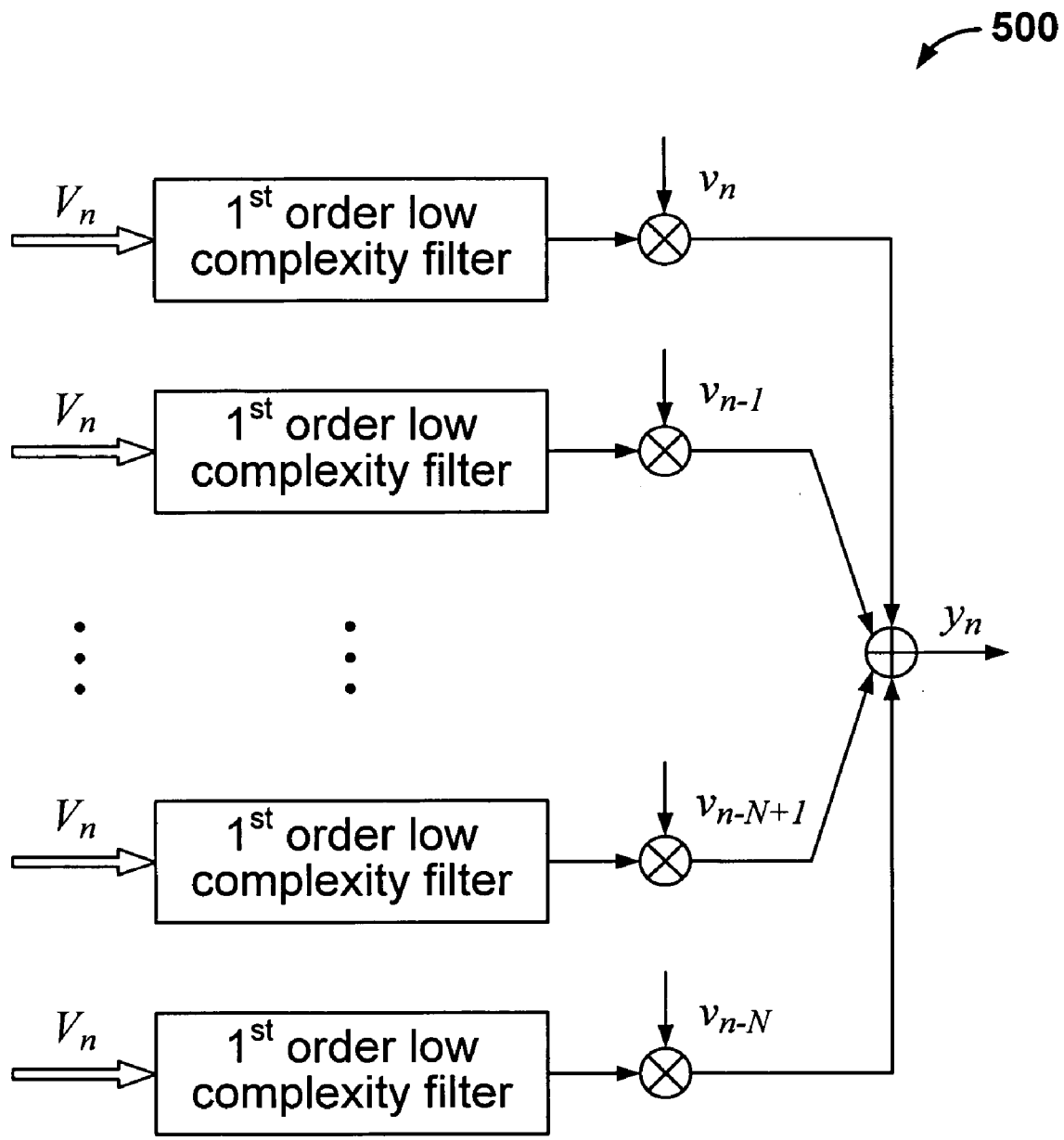
FIG. 5 is a block diagram illustrating a second order low complexity nonlinear filter embodiment.

FIG. 5 is a block diagram illustrating a second order low complexity nonlinear filter embodiment. In this example, second order low complexity filter 500 is implemented using a plurality of first order low complexity filters. The coefficients of the first order low complexity filters are computed using techniques such as least mean squared error. The input vector is sent to each of the first order low complexity filters, and each of the filter output is multiplied with a corresponding input variable. The results are combined to generate the output $y_n$.

Figure 6:
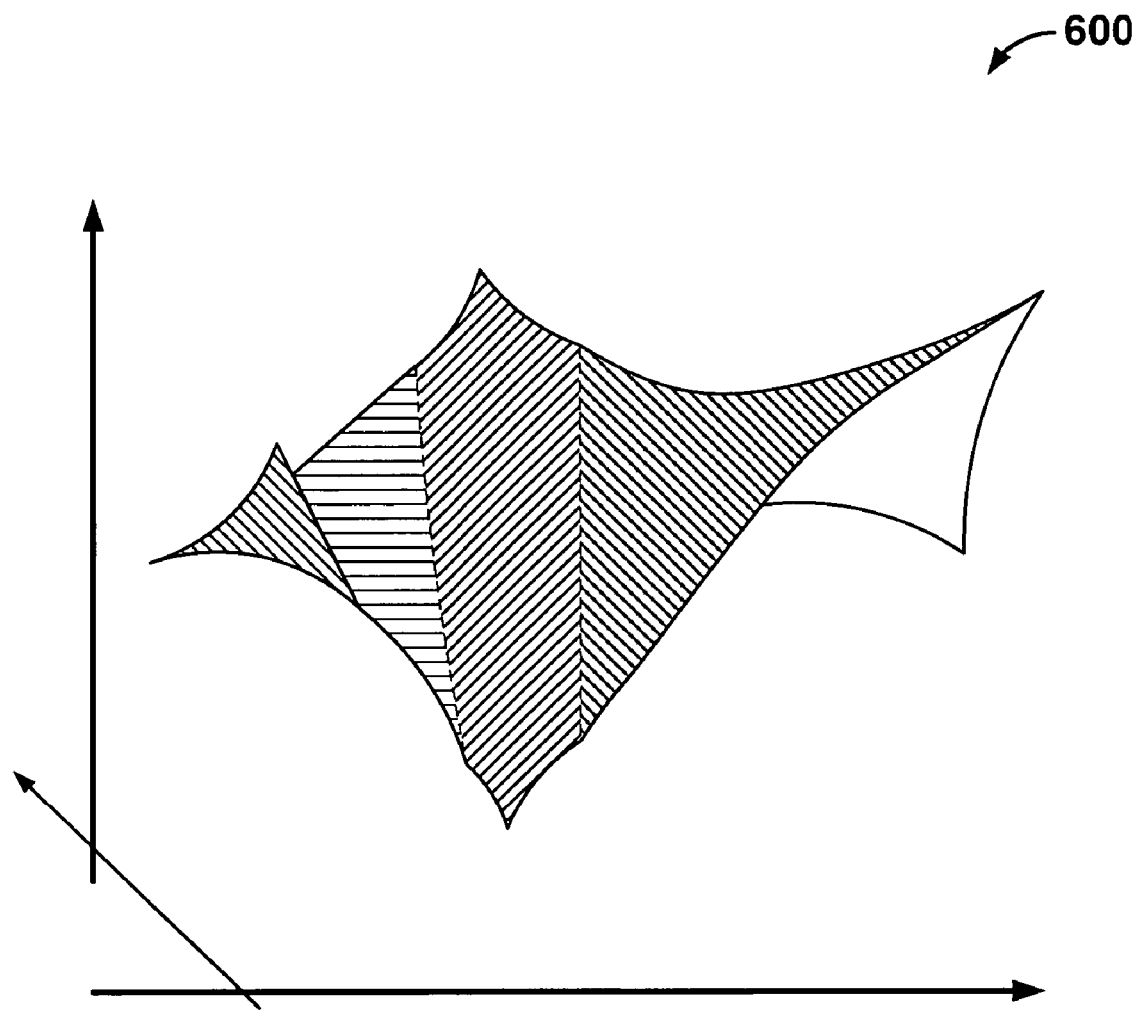
FIG. 6 is a diagram illustrating a 3-D manifold of the output of a second order nonlinear filter embodiment.

FIG. 6 is a diagram illustrating a 3-D manifold of the output of a second order nonlinear filter embodiment. In this example, filter function 600 is a function of two input variables. The second order terms form parabolic segments of the manifold. Higher order filters such as this can sometimes be used to better approximate the multi-dimensional manifold that defines the desired nonlinear function, such as the actual transfer function of a system, an error function, etc.

Figure 7:
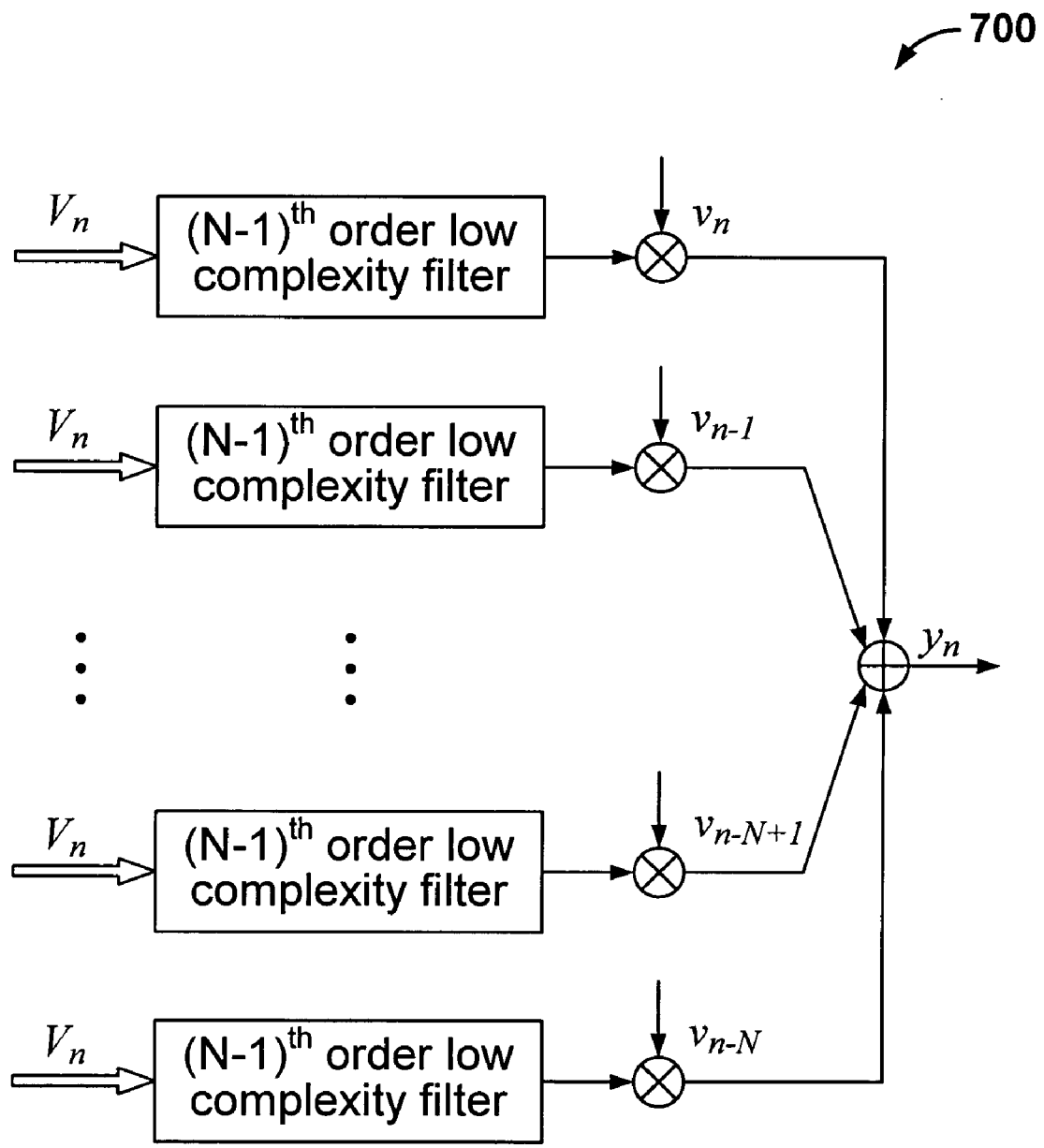
FIG. 7 is a block diagram illustrating an N-th order nonlinear filter embodiment.

The approach can be further extended to develop third or higher order nonlinear filters. FIG. 7 is a block diagram illustrating an N-th order nonlinear filter embodiment. In the example shown, a filter of order N (N>2) is implemented by nesting lower order filters. N-th order low complexity filter 700 includes a plurality of (N−1)-th order low complexity filters. The outputs of the (N−1)-th order filters are multiplied with the input variables. Thus, the (N−1)-th order filters act as input coefficients of the N-th order filter. Each of the (N−1)-th order filter in turn may be implemented using a plurality of (N−2)-th order low complexity filters as input coefficients. Nesting allows higher order filters to be more easily implemented.

In some embodiments, the nonlinear filter is implemented as a zero order nonlinear filter, where the transfer function of the filter in each discrete region is a constant. An example of the filter response of zero order is shown as 104 of FIG. 1C. The zero order filter is sometimes referred to as a "catastrophic" structure because of the discontinuities in the filter response. A general form of a zero order nonlinear filter is expressed as:

$$y_n = a_0 + a_1 + \ldots + a_{2N-2} + b + \quad \text{(equation 17)}$$
$$\sum_{j=1}^{K} c_j^0 \lambda_j^0 + \sum_{j=1}^{K} c_j^1 \lambda_j^1 + \ldots + \sum_{j=1}^{K} c_j^{2N-2} \lambda_j^{2N-2}.$$

In some embodiments, the zero order nonlinear filter based on equation 17 is implemented similarly as filter 300 of FIG. 3, except that the multiplications by $v_n$, $v_{n-1}$, etc. are omitted and the outputs $$a_0 + \sum_{j=1}^{K} c_j^0 \lambda_{jn}^0, \quad a_N + \sum_{j=1}^{K} c_j^1 \lambda_{jn}^1,$$

etc. are summed directly.

Figure 8A:
FIGS. 8A and 8B are block diagrams illustrating a nonlinear filter embodiment.
Figure 8B:
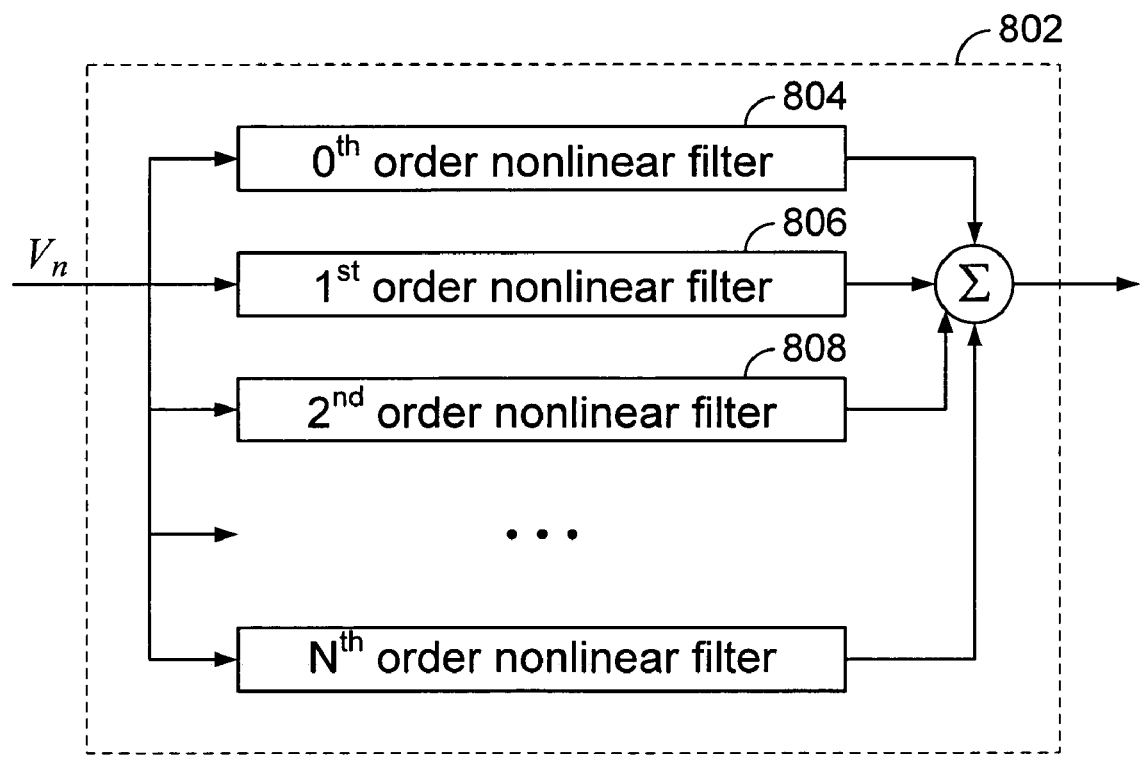

Nonlinear filters of different orders can be combined to form a new filter with desired transfer function. FIGS. 8A and 8B are block diagrams illustrating a nonlinear filter embodiment. In the example shown, nonlinear filter 802 is implemented using a zero order nonlinear filter 804, a first order nonlinear filter 806, a second order nonlinear filter 808 and other higher order nonlinear filters up to order N. More than one filter of a certain order may be used. One or more orders may be omitted. The selection of N depends on the requirements of filter 802 and may vary for different embodiments. A single zero order nonlinear filter may be sufficient for some applications while an N greater than 3 may be required for some others. A nonlinear filter constructed by combining different orders of nonlinear filters can achieve the desired filter requirements with improved computational efficiency.

The complexity of nonlinear filters can be further reduced in some embodiments. Take the following first order filter for example:

$$y_n = a_0 v_n + a_1 v_{n-1} + b + \sum_{j=1}^{K} c_j^0 |v_n + \beta_j^0| + \quad \text{(equation 18)}$$
$$\sum_{j=1}^{K} c_j^1 |v_{n-1} + \beta_j^1|$$
$$= \left(a_0 + \sum_{j=1}^{K} c_j^0 \lambda_j^0\right) v_n + \left(a_1 + \sum_{j=1}^{K} c_j^1 \lambda_j^1\right) v_{n-1} +$$
$$\left(b + \sum_{j=1}^{K} c_j^0 \lambda_j^0 \beta_j^0 + \sum_{j=1}^{K} c_j^1 \lambda_j^1 \beta_j^1\right)$$
$$= \tilde{a}_{0,n} v_n + \tilde{a}_{1,n} v_{n-1} + \tilde{b}_n$$

where $$\lambda_j^m = \text{sign}(v_n + \beta_j^m) \quad \text{(equation 19)}.$$

Since $\lambda_j^1 = \pm 1$, the coefficient $$\sum_{j=1}^{K} c_j^m \lambda_j^m$$

can be computed without any multiplication. Similarly, $$\sum_{j=1}^{K} c_j^m \lambda_j^m \beta_j^m$$

can also be computed without multiplications since the product $c_j^m \beta_j^m$ can be pre-computed, stored and looked up when needed. Thus, the nonlinear filter of equation 18 can be implemented as a first order filter that requires only two multiplication operations.

Figure 9:
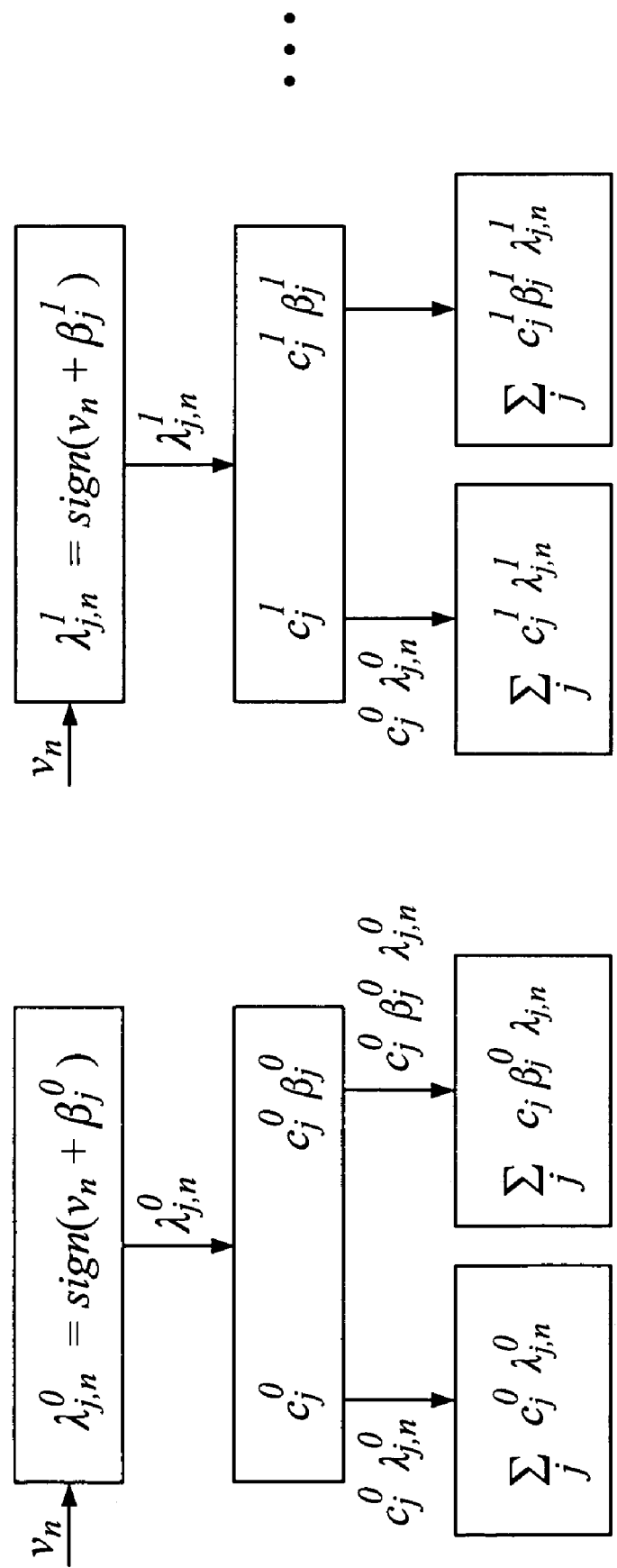
FIG. 9 is a diagram illustrating a computational block embodiment used to compute the nonlinear filter coefficients.

FIG. 9 is a diagram illustrating a computational block embodiment used to compute the nonlinear filter coefficients. In this example, the coefficients for the filter shown in equation 18 are computed. Different ranges of inputs result in different $\lambda_j^m$, which can be either 1 or −1. Potential coefficient values $$\sum_{j=1}^{K} c_j^m \lambda_j^m \quad \text{and} \quad \sum_{j=1}^{K} c_j^m \lambda_j^m \beta_j^m$$

that correspond to different input ranges are pre-computed and stored in registers. When an input is received, it is compared with the set of $\beta_j^m$ to determine its relative location in the range of inputs and the corresponding pre-computed coefficient value for this particular location.

Figure 10:
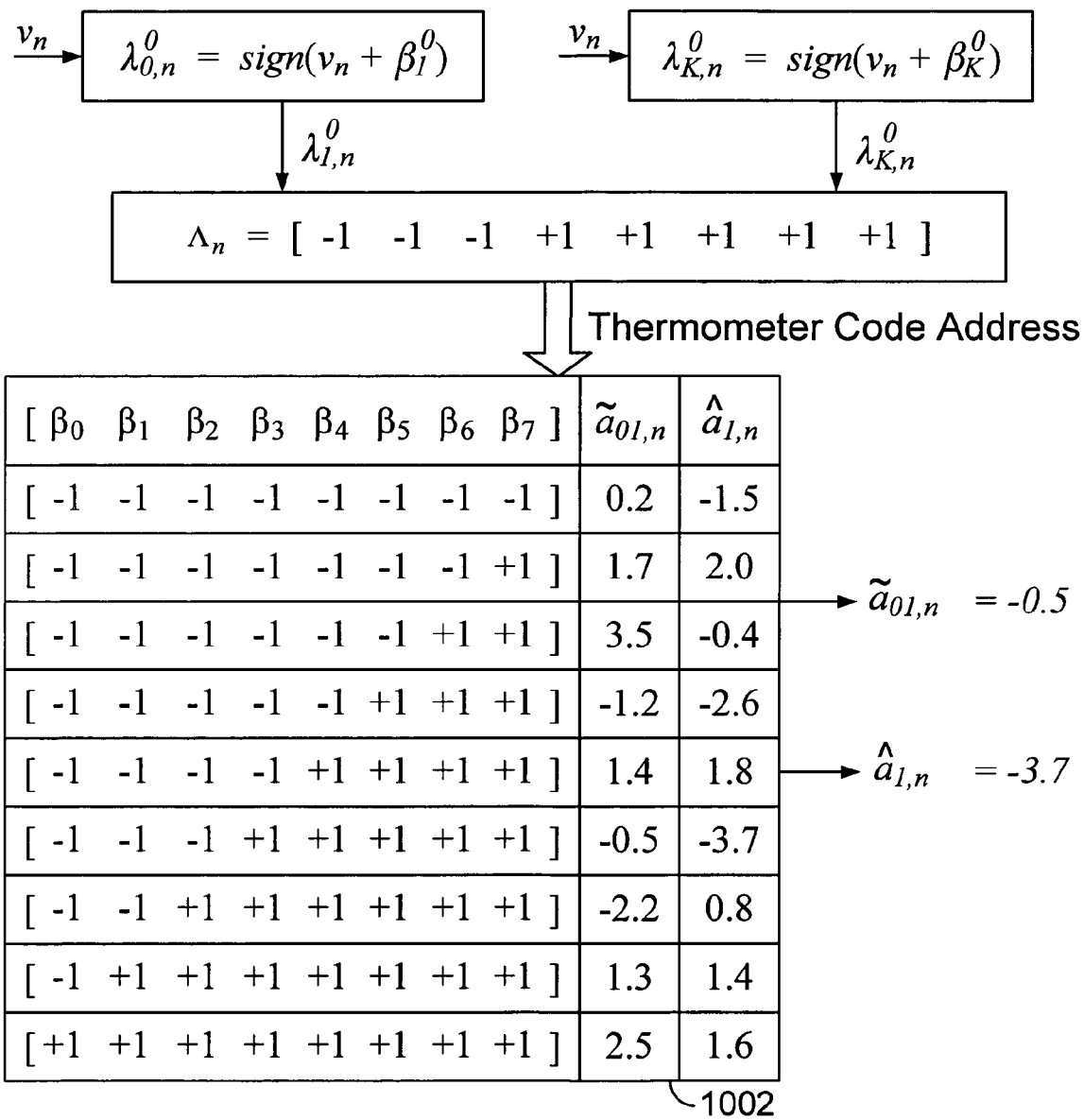
FIG. 10 is a block diagram illustrating another computational block used to compute the nonlinear filter coefficient according to another embodiment.

FIG. 10 is a block diagram illustrating another computational block used to compute the nonlinear filter coefficient according to another embodiment. In this example, the coefficient value is determined using an indicator that indicates the relative location of the input within the range of possible inputs. The indicator used in this case is a "thermometer code," which is a vector having a total of at most one sign change among any two adjacent variables. In the example shown, every term of the thermometer code has an equal magnitude of 1.

Take the following second order function as an example:

$$y_n = a_0 v_n + a_1 v_{n-1} + b + \sum_{j=1}^{K} c_j^0 |v_n + \beta_j^0| v_n + \sum_{j=1}^{K} c_j^1 |v_{n-1} + \beta_j^1| v_n$$

$$= \left(\sum_{j=1}^{K} c_j^0 \lambda_j^0\right) v_n^2 + \left(\sum_{j=1}^{K} c_j^1 \lambda_j^1\right) v_n v_{n-1} +$$

$$\left(a_0 + \sum_{j=1}^{K} c_j^0 \lambda_j^0 \beta_j^0 + \sum_{j=1}^{K} c_j^1 \lambda_j^1 \beta_j^1\right) v_n + a_1 v_{n-1} + b$$

$$= \tilde{a}_{01,n} v_n^2 + \hat{a}_{1,n} v_n v_{n-1} + \tilde{a}_{0,n} v_n + a_1 v_{n-1} + b.$$

(equation 20)

The input is compared to the set of $\beta_j^K$ values to determine the relative location of the input variable within the range of possible inputs, and the vector of $\lambda_{j,n}$, denoted as $\Lambda_n$. Depending on the input, $\Lambda_n$ may be a vector with terms that are +1 only, −1 only, or −1 for the first k terms and +1 for the rest of the terms. In other words, $\Lambda_n$ is a thermometer code with at most one sign change among its terms. For example, assuming that constants $\beta_j^K$ are distributed across the dynamic range of $v_n \in (-1, 1)$ and there are $$8 \text{ values of } \beta_j^k \in \left(-\frac{4}{7} \ -\frac{3}{7} \ -\frac{2}{7} \ -\frac{1}{7} \ \frac{1}{7} \ \frac{2}{7} \ \frac{3}{7} \ \frac{4}{7}\right).$$

If $v_n < -\frac{4}{7}$, $\Lambda_n = [-1 -1 -1 -1 -1 -1 -1 -1]$.

If $v_n > \frac{4}{7}$, then $\Lambda_n = [+1 +1 +1 +1 +1 +1 +1 +1]$.

If $v_n$ is somewhere in between, $\Lambda_n$ may have a sign change. For example, if $$v_n = -\frac{3.5}{7}, \text{ then } \Lambda_n = [-1 -1 -1 -1 -1 -1 -1 +1].$$

If $v_n = \frac{1.5}{7}$, then $\Lambda_n = [-1 -1 -1 +1 +1 +1 +1 +1]$.

Since the thermometer code has only 8 values, there are only 8 possible values for $$\tilde{a}_{01,n} = \sum_{j=1}^{K} c_j^0 \lambda_j^0,$$

8 possible values for $$\hat{a}_{1,n} = \sum_{j=1}^{K} c_j^1 \lambda_{j,n}^1,$$

and 64 possible values for $$a_{0,n} = a_0 + \sum_{j=1}^{K} c_j^0 \lambda_j^0 \beta_j^0 + \sum_{j=1}^{K} c_j^1 \lambda_j^1 \beta_j^1.$$

The number of add operations can be reduced by pre-computing the possible values for coefficients of $\tilde{a}_{01,n}$, $\hat{a}_{1,n}$, etc. and storing them in memory. In this example, the addresses of the coefficients are stored in a lookup table 1002, which stores the 8 possibilities of thermometer code $\Lambda_n$ and the corresponding addresses of pre-computed coefficients. The coefficients can be retrieved by accessing the memory addresses that correspond to the appropriate thermometer code entry. Once the coefficients $\tilde{a}_{01,n}$, $\hat{a}_{11,n}$ etc. . . . are read out of memory, the filter output can be computed as $$y_n = \tilde{a}_{01,n} v_n^2 + \hat{a}_{1,n} v_n v_{n-1} + \tilde{a}_{0,n} v_n + a_{1,n} v_{n-n} + b \quad \text{(equation 22)}.$$

This technique is also applicable to zero, first or higher order filters.

A technique for nonlinear system signal processing has been disclosed. By using pre-computed filter coefficients and nested nonlinear filters, complexities in computation and filter implementation are reduced.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of processing an input signal that includes an input variable, comprising:
    comparing the input variable to a set of ordered constants;
    determining the relative location of the input variable within a range of possible inputs; and
    determining, using a processor, a filter coefficient of a nonlinear filter using the relative location of the input variable.

2. A method as recited in claim 1, further comprising generating an output by filtering the input signal using the nonlinear filter.

3. A method as recited in claim 1, wherein the set of ordered constants are constants that divide the range of possible inputs.

4. A method as recited in claim 1, wherein determining the relative location of the input variable comprises determining from the comparison an indicator that indicates the relative location of the input variable.

5. A method as recited in claim 1, wherein determining the relative location of the input variable comprises determining from the comparison an indicator that indicates the relative location of the input variable; and the indicator includes a thermometer code.

6. A method as recited in claim 1, wherein the filter coefficient is determined without using multiplication operation.

7. A method as recited in claim 1, wherein the filter coefficient a pre-computed value that is stored in a memory location.

8. A method as recited in claim 1, wherein:
the filter coefficient is pre-computed and stored in a memory location;
determining the relative location of the input variable within a range of possible inputs comprises determining from the comparison an indicator that indicates the memory location and accessing the memory location.

9. A method as recited in claim 1, further comprising using the nonlinear filter as a higher order coefficient of a higher order nonlinear filter.

10. A method as recited in claim 1, further comprising using the nonlinear filter as a higher order coefficient of a higher order nonlinear filter and generating an output by filtering the input signal using the higher order nonlinear filter.

11. A method as recited in claim 1, wherein the filter coefficient is a constant.

12. A method as recited in claim 1, wherein the coefficient is multiplied by a characteristic of the input signal.

13. A method as recited in claim 1, wherein the filter coefficient is a lower order filter coefficient and the method further comprising multiplying the lower order filter coefficient with a characteristic of the input signal to obtain a higher order filter coefficient of a higher order filter.

14. A method as recited in claim 1, wherein:
the nonlinear filter is a lower order nonlinear filter;
the filter coefficient is a lower order filter coefficient; and
the method further comprising:
multiplying the lower order filter coefficient with a characteristic of the input signal to obtain a higher order filter coefficient of a higher order nonlinear filter; and
sending an output of the lower order filter to be processed by the higher order filter.

15. A method as recited in claim 1, wherein the nonlinear filter has a linear transfer function at the determined relative location.

16. A method as recited in claim 1, wherein the nonlinear filter has a nonlinear transfer function at the determined relative location.

17. A configurable filter comprising:
an interface configured to receive an input signal that includes an input variable;
a nonlinear filter coupled to the interface, configured to process the input signal; and
a processor coupled to the nonlinear filter, configured to determine the relative location of the input variable within a range of possible inputs and to determine a filter coefficient of the nonlinear filter using the relative location of the input variable.

18. A configurable filter as recited in claim 17, wherein the set of ordered constants are constants that divide the range of possible inputs.

19. A configurable filter as recited in claim 17, wherein the processor is configured to determine the relative location of the input variable by determining from the comparison an indicator that indicates the relative location of the input variable.

20. A configurable filter as recited in claim 17, wherein the filter coefficient is determined without using multiplication operation.

21. A configurable filter as recited in claim 17, wherein the filter coefficient a pre-computed value that is stored in a memory location.

22. A configurable filter as recited in claim 17, wherein the nonlinear filter is a zero order filter.

23. A configurable filter as recited in claim 17, wherein the nonlinear filter is a coefficient to a higher order nonlinear filter.

24. A computer program product for processing an input signal that includes an input variable, the computer program product being embodied in a computer readable medium and comprising computer instructions for:
comparing the input variable to a set of ordered constants;
determining the relative location of the input variable within a range of possible inputs; and
determining, using a processor, a filter coefficient of a nonlinear filter using the relative location of the input variable.

* * * * *